(12) United States Patent
Kawamura

(10) Patent No.: US 6,252,466 B1
(45) Date of Patent: Jun. 26, 2001

(54) POWER-UP DETECTOR FOR A PHASE-LOCKED LOOP CIRCUIT

(75) Inventor: J. Patrick Kawamura, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/547,818

(22) Filed: Apr. 11, 2000

Related U.S. Application Data

(60) Provisional application No. 60/171,795, filed on Dec. 22, 1999.

(51) Int. Cl.[7] .............................. H03L 7/089; H03L 7/095
(52) U.S. Cl. .................................. 331/25; 331/1 A; 331/8; 331/17; 331/DIG. 2; 327/156; 327/157; 327/159
(58) Field of Search ................................. 331/1 A, 8, 16, 331/17, 18, 25, DIG. 2; 327/143, 156–159

(56) References Cited

U.S. PATENT DOCUMENTS

| 4,437,072 | * | 3/1984 | Asami | 331/1 A |
| 5,719,532 | * | 2/1998 | Nayebi et al. | 331/20 |
| 5,724,007 |   | 3/1998 | Mar . |   |
| 5,784,122 | * | 7/1998 | Nayebi et al. | 348/549 |
| 5,822,387 |   | 10/1998 | Mar . |   |
| 5,870,002 | * | 2/1999 | Ghaderi et al. | 331/17 |

* cited by examiner

Primary Examiner—David Mis
(74) Attorney, Agent, or Firm—William B. Kempler; Frederick J. Telecky, Jr.

(57) ABSTRACT

PLL power up detector includes a capacitor coupled to a charging circuit. The capacitor is charged to a level responsive to the pulse width of the UP and DOWN signals produced by the PFD circuit included in the PLL circuit. When the PLL is near or at the locked state, the UP and DOWN signals will exhibit short high-going pulses or remain at ground level, allowing charger circuit increase the voltage on the capacitor. The Schmitt trigger circuit senses the voltage level on the capacitor and outputs a signal indicating the PLL is near or at the locked state. The Schmitt trigger output signal is coupled to a counter circuit to further validate the lock state of the PLL. The Schmitt trigger output signal must remain at the locked state for n-consecutive reference clock cycles before the PLL power-up signal, is asserted. When the power-up signal is asserted, the charging circuit is disabled and PLL power up detector will not consume quiescent current.

20 Claims, 3 Drawing Sheets

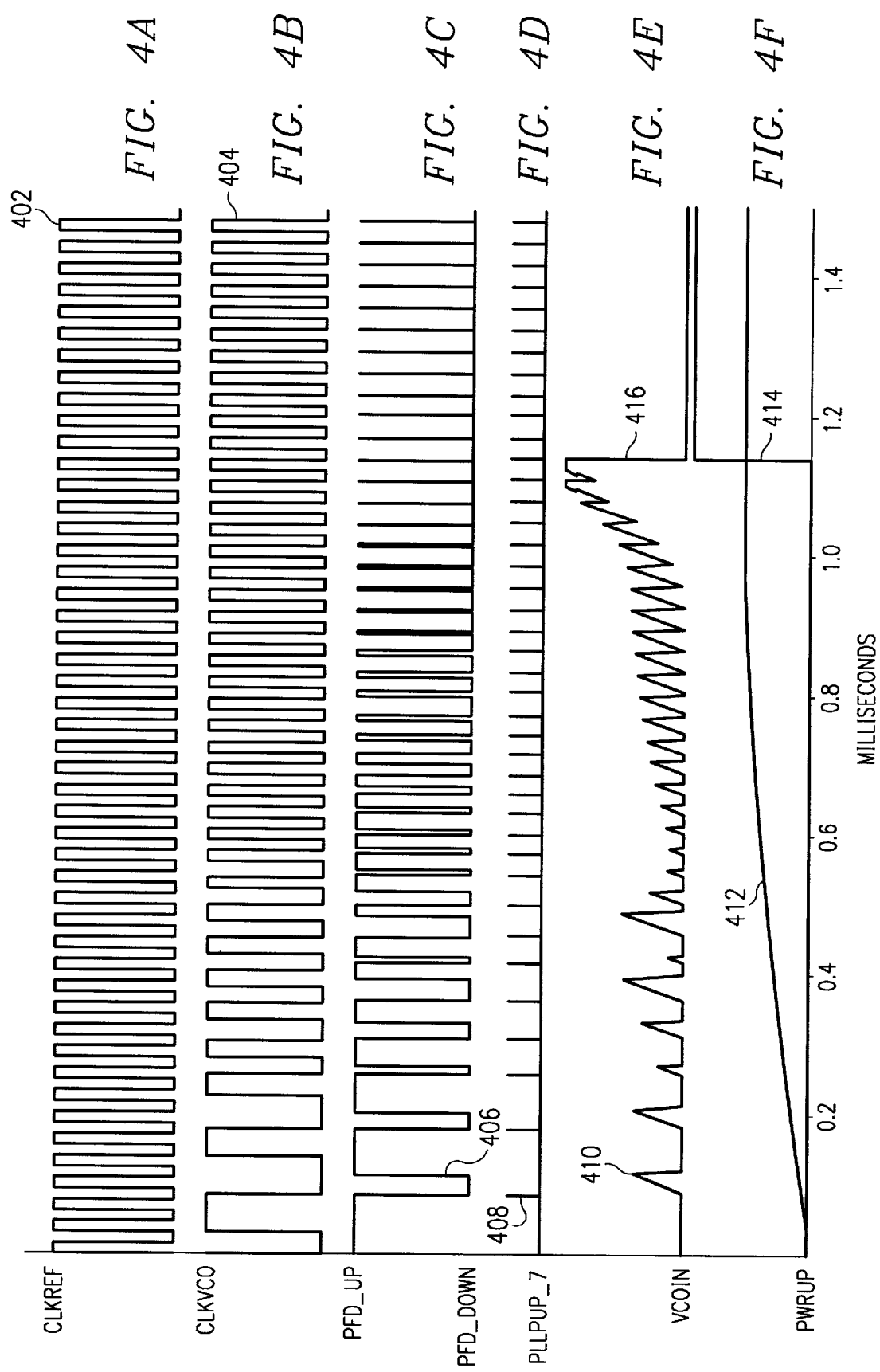

POWER-UP DETECTOR FOR A PHASE-LOCKED LOOP CIRCUIT

This application claims priority under 35 U.S.C. § 119 (e)(1) of Provisional Application Number 60/171,795, filed Dec. 22, 1999.

BACKGROUND OF THE INVENTION

This invention relates to a power-Up detector for a phase-locked loop (PLL) circuit and more specifically to a PLL circuit for, inter alia, a switching regulator for a cellular telephone.

A PLL circuit is typically employed as a frequency synthesizer, analog modulator or demodulator and can be used in power regulators, communication circuits, clock synthesizers, and frequency synchronization circuits. A basic PLL circuit requires three parts: a phase/frequency detector (PFD), a loop filter, commonly a low-pass filter, and a voltage-control led oscillator (VCO). A conventional configuration is to utilize a charge pump between the output of the PFD and the input to the VCO.

The PFD is responsive to two signals, an input reference signal and the output of the VCO, which is fed back to an input of the PFD. The PFD produces two output signals, UP and DOWN that are used to control the output frequency of the VCO. When the signal fed back to the PFD is substantially the same frequency and phase as the input reference signal, the PLL circuit is said to be phase-locked and the UP and DOWN signal both assume a state which indicates this condition, typically a logic low state. If the input reference signal makes a transition and this transition lags the transition of the VCO output signal going in the same direction, the DOWN signal will pulse high for the duration of the lag time between the signals. If the output signal makes a transition and this transition lags the transition of the input reference signal going in the same direction, the UP signal will pulse high for the duration of the lag time between the signals. The UP and DOWN signals are utilized to control the frequency of the VCO as is well known in the art. Until the reference and the VCO output are near or at equal phase and frequency synchronization, or in a "locked" stated, the PLL will run at some indeterminate frequency and duty cycle. This will create problems for duty cycle sensitive circuits such as switching regulators used in power management integrated circuits.

For example, if at power-up when the PLL circuit has not yet achieved "lock", the PLL circuit outputs a clock signal with a long duty cycle and period causing the switching transistor of a boost mode switching regulator on a power management IC to be ON for an extended period, resulting in the saturation of the inductor core of the switching regulator without supplying current to the load. A voltage-control mode switching regulator would then keep sinking high amount of current through the switching transistor until the PLL output clock signal makes a transition to turn off the switching transistor.

The current will eventually decrease and regulator output stabilize to the target value as the PLL circuit nears lock and the duty cycle and frequency reach a steady state. Thus, to reduce the high current waste in the switching regulator at device startup, the PLL circuit must either quickly power-up at the correct frequency and duty cycle, or the PLL output clock must be masked (not allowing the switching regulator to operate) until such time after power-up that the frequency and duty cycle both stabilize to their steady-state values.

Prior art PLL circuit power-up detectors can be categorized into three groups:

Those circuits that use a binary counter to count the number of reference cycles, enabling the power-up signal after a pre-programmed number of cycles are counted. If RC (low pass) filtered UP/DOWN pulses are detected, the counters are reset to turn off the power-up signal.

Circuits that use a RC circuit that discharges whenever there is a non-zero pulse generated by the RC (low pass) filtered UP/DOWN signals. When the PLL circuit is nearly locked, the RC charging circuit is allowed to charge up to a logic high, activating the power-up signal.

Circuits that use a pulse width filter on the UP/DOWN pulses to control the charging of a switched capacitor. When the pulse width is less than a predetermined threshold the switched capacitor is allowed to charge up. After a certain number of reference clock cycles the capacitor voltage trips a switch to activate the power-up signal. If the UP/DOWN pulse width is longer than the predetermined value, the switched capacitor is discharged and the power-up signal activation signal is delayed. A circuit of this type is shown in the U.S. Pat. No. 5,724,007. Circuits of this type are subject to variations in operation caused by device operating conditions and variations in component values resulting from process variations.

SUMMARY OF THE INVENTION

It is a general object of the present invention to provide a power-up detector for a phase-locked loop (PLL).

A further object of the present invention is to provide a power-up detector for a PLL that detects power-up when the PLL is actually at or near lock.

Another object of the invention is a PLL power-up detector which can operate with devices with tight power-up timing specifications.

Yet another object of the present invention is a PLL power-up detector which can withhold the output of the VCO to a switching regulator of a power IC until lock is achieved.

These and other objects are achieved, in accordance with one aspect of the invention, by a phase locked loop having UP and DOWN signals responsive to a reference clock and a VCO output signal for controlling an input voltage to a VCO. A power-up detector having a first constant current source is coupled to a capacitor for charging the capacitor. A second constant current drain is coupled to the capacitor and responsive to the UP signal and to the DOWN signal for discharging the capacitor. A voltage detector is coupled to the capacitor for detecting voltage on the capacitor and for generating an output signal when the voltage reaches or exceeds a predetermined level.

Another aspect of the invention includes a phase locked loop circuit comprising a VCO, a loop filter coupled to a control input of the VCO, a charge pump coupled to the loop filter and a phase-frequency detector (PFD) coupled to the charge pump. The (PFD) receives a VCO output signal and a reference clock signal as inputs and generates a DOWN output signal if the reference clock signal makes a transition which lags the transition of the VCO output signal going in the same direction and an UP output signal if the VCO output signal makes a transition which lags the transition of the reference clock going in the same direction. A power-up detector comprises a capacitor and a first constant current source is coupled to the capacitor for charging the capacitor, a second constant current source coupled to the capacitor and responsive to the UP signal and the DOWN signal for discharging the capacitor, a voltage detector coupled to the capacitor for detecting a voltage on the capacitor for generating an output signal when the voltage reaches or exceeds a predetermined level.

Another aspect of the invention comprises a cellular telephone containing switching regulators for powering telephone circuits. The regulators are comprised of switching transistors, inductors, diodes, resistors, and control circuitry and are generally known as "boost" and "buck" converters, and are conventional in the art. The timing reference signal for the switching transistors is provided by the switching control signal generated by a phase-locked loop circuit. The phase-locked loop comprises a VCO, a loop filter coupled to a control input of the VCO, a charge pump coupled to the loop filter, and a phase-frequency detector (PFD) coupled to the charge pump. The PFD receives a VCO output signal and a reference clock signal as inputs and (generates an UP output signal if the reference clock signal makes a transition which lags the transition of the VCO output signal going in the same direction and a DOWN output signal if the VCO output signal makes a transition which lags the transition of the reference clock going in the same direction, a power-up detector is coupled between the phase-locked loop circuit and the switching regulator for withholding the timing control signal from the switching regulator until the phase-locked loop achieves lock or near-lock, the power-up detector comprising a capacitor, a first constant current source is coupled to the capacitor for charging the capacitor, a second constant current source is coupled to the capacitor and responsive to the UP signal and to the DOWN signal for discharging the capacitor, voltage detector is coupled to the capacitor for detecting a voltage on the capacitor for generating an output signal when the voltage reaches or exceeds a predetermined level.

The newer specifications for power-up of a cellular telephone call for the telephone regulator circuits to be enabled in less than five milliseconds. The devices of the prior art did not specify such a tight power-up timing specification, and devices did not enable fast enough to the meet the specification across temperature, voltage, and process variation. Thus, a new solution is required.

BRIEF DESCRIPTION OF THE DRAWINGS

FIGS. 4A–4F show the signals in a simulation of the present invention.

DETAILED DESCRIPTION

Figure 1:
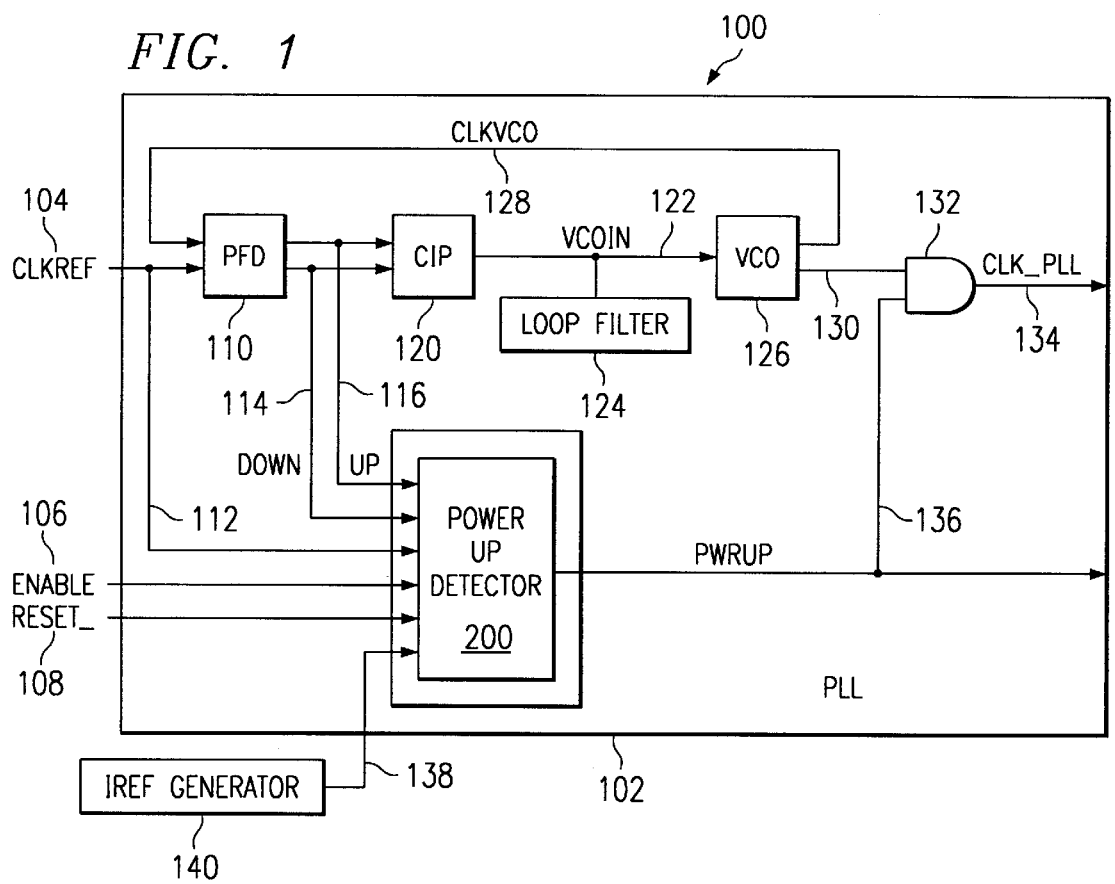
FIG. 1 shows a block diagram of a phaselocked loop (PLL) circuit in accordance with the present invention.

Referring to FIG. 1, a block diagram of a PLL circuit according to the present invention is generally shown as 100. The circuit 100 comprises a PLL 102 and a current reference 140. The PLL comprises a PFD 110 which is conventional in the art and which is responsive to the reference clock CLKREF 104 and the VCO output signal CLKVCO 128. The PFD has two output signals, DOWN 114 and UP 116, which are input to the charge pump circuit 120. The charge pump circuit, which is also conventional in the art, has an output VCOIN on line 122 which is input to the VCO 126. Coupled to the signal VCOIN on line 122 is a loop filter 124, which is also conventional in the art. The VCO, which is also conventional in the art has two outputs on lines 128 and 130. The output on line CLKVCO 128 is fed back to an input of the PFD. The output on line 130 is gated by AND gate 132 to generate the signal CLK_PLL which is fed, for example, to a switching regulator (not shown). The output signal on line 130 is at a frequency which is N times the frequency of the output signal CLKVCO 128. A divide by N counter is incorporated into the VCO 126 for generating the signal on line 128. N may be 8, for example, with the signal CLKREF and CLKVCO 128 operating at 32 KHz and the output on line 130 being at a frequency of 256 KHz when the PLL is in a locked state. A power-up detector 200 is coupled to receive a DOWN signal 114 and the UP signal 116 as well as enable signal 106 and reset signal 108. The power-up detector 200 also receives the output of the current reference generator 140 on line 138.

The PFD 110 produces high-going pulses at the output terminals, UP 116 and DOWN 114, respectively, which are responsive to the phase difference (or phase error) between the input reference signal CLKREF 104 and the VCO output signal CLKVCO 128 fed back from the output of VCO 126. If the signal CLKREF 104 makes a transition and this transition lags the transition of the signal CLKVCO 128 going in the same direction, the DOWN signal 114 will have a high pulse for the duration of the lag time between the signals. If the feedback signal CLKVCO 128 makes a transition and this transition lags the transition of the signal CLKREF 104 going in the same direction, the UP signal 116 will have a high pulse for the duration of the lag time between the signals. If the signal CLKREF 104 makes a transition and this transition is coincident or near coincident with the transition of the signal VCO 128 going in the same direction, the signal UP 116 and DOWN 114 will stay low or pulse only for a very short time.

Charge pump 120 is conventional in the art and is responsive to the UP signal 116 and the DOWN signal 114, to translate the phase error encoded as pulse duration in the signals UP and DOWN to an amount of charge deposited to or removed from the output terminal 122. In other words, it converts the phase error in terms of time (lead/lag) to a phase error in terms of an amount of charge. The charge pump 120 supplies the charge from a positive supply reference to the output terminal 122 in an amount of current proportional to the duration of the UP pulse 116. The charge pump 120 removes charge from the output terminal 122 to a ground reference, the amount of charge being proportional to the duration of the DOWN pulse 114.

The loop filter circuit 124 is coupled to the input of the charge pump VCOIN on line 122 and is conventional in the art. A loop filter 124 is used to translate the phase error, represented as charge deposited on or withdrawn from the charge pump output terminal 122, into a voltage signal. This filter is typically implemented as a low pass filter and the actual implementation affects the shape and transfer characteristics of the voltage signal at line 122. The many forms of loop filter circuit 124 are well known in the art and will not be described further here.

The voltage controlled oscillator (VCO)126 is also conventional in the art and may take any one of the many forms that are well known in the art. The VCO 126 is responsive to the VCO tuning signal VCOIN applied on line 122 to generate an output clock CLKVCO on line 128 and one or more additional output clock signals such as the one on line 130, which runs at a multiple of the frequency of the signal CLKVCO on line 128. The VCO output clock signal CLKVCO runs at a frequency that is proportional to the voltage VCOIN on line 122. A higher voltage on line 122 results in a higher frequency output for the VCO and a lower frequency output is the response to a lower voltage on line 122.

The PLL circuit formed by the PFD 110, charge pump 120, loop filter 124, and voltage controlled oscillator VCO 126 with the control loop closed by the signal VCOCLK on line 128, works by having the control loop modulate the VCO tuning voltage VCOIN at terminal 122 to match the frequency of the VCO output signal CLKVCO with the reference clock CLKREF. When the reference clock CLKREF on line 104 and the VCO output signal CLKVCO on line 128 are in or near phase and frequency synchronization, the PLL is said to be locked.

The PLL circuit power-up detector 200 is responsive to the phase error signals UP on line 116 and DOWN on line 114 generated by the PFD, as well as the reference clock signal CLKREF 104 and the enabling signal 106 and reset signal 108 to indicate when the PLL circuit is near or at the locked state to generate the PLL power-up indicator signal PWRUP on line 136. The PWRUP signal on line 136 can be coupled to an input of an AND gate 132 which serves as a gating signal for the VCO output clock on line 130. While the PLL circuit is powering-up upon the application of power to the integrated circuit, and the PLL is not in a locked state, the VCO output clock on line 130 will be running at a frequency other than the specified frequency. The PLL circuit power-up detector will output a PWRUP signal on line 136 at a low logic state, which will keep the PLL clock signal CLK_PLL on line 134 at a logic low state. Only when the PLL powers-up and is in a locked state will the VCO output clock on line 130 be transmitted through the AND gate 132 to drive the signal CLK_PLL on line 134 for use by other circuits residing on or off the integrated circuit. For example, the PWRUP signal 136 can be utilized as a signal to alert the processor that the PLL circuit is in a locked state to initiate device operation after power-up or when the device wakes up from a power-saving sleep mode.

Figure 2:
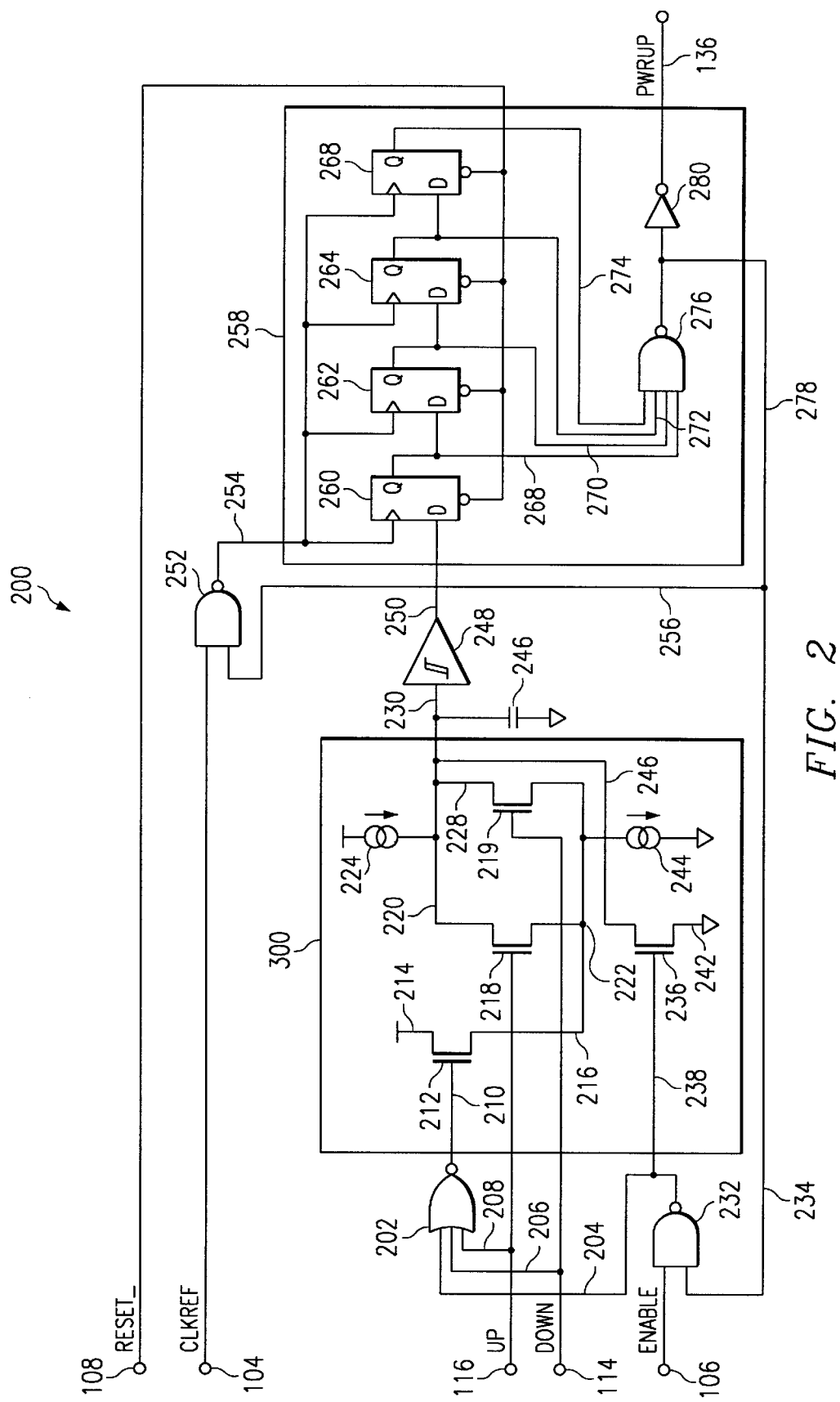
FIG. 2 shows a schematic block diagram of the power-up detector of FIG. 1.

The reference current generator 140 is conventional in the art and can be a supply voltage independent current source having a constant output current of one microampere, for example. FIG. 2 shows the power-up detector 200 in greater detail. The UP signal on line 116 is coupled to the gate of NMOS transistor 218 which the drain is coupled to the output of constant current source 224. The DOWN signal on line 114 is coupled to the gate of NMOS transistor 219 which the source is coupled to the output of constant current source 224. Constant current source 224 is also coupled to the positive power supply. The sources of both transistors are connected at 216 to a second constant current source 244 which has its opposite end coupled to ground. The output of this charging circuit on line 230 is coupled to capacitor 246. The voltage on capacitor 246 is measured by Schmitt trigger 248. The capacitor 246 is charged to a voltage level as determined by the pulse width of the UP 116 and DOWN 114 signals produced by the PFD circuit 110 in FIG. 1. When the PLL circuit is in the process of powering-up after a voltage is applied to the integrated circuit, the UP or DOWN signals coupled to the gate terminal of NMOS devices 218 and 219, respectively, will exhibit long high-going pulses, which enables one of the two transistors to conduct. The conduction of current through transistors 218 or 219 allows the charging circuit 300 to discharge the charge on the capacitor 246. When the PLL circuit is near or at a locked state, the UP signal on line 116 or DOWN signal on line 114 exhibits short high-going pulses or remain at ground level, which will allow the current source 224 of charging circuit 300 to increase the voltage on the capacitor 246. The Schmitt trigger circuit 248 senses the voltage level on the capacitor 246 and generates an output signal at a logic high level when the PLL is near or at the locked state. The Schmitt trigger output signal on line 250 is coupled to a counter circuit 258 to further validate the locked state of the PLL. In the illustrated embodiment, the Schmitt trigger output signal 250 must remain at the locked state for four consecutive reference clock cycles before the PLL power-up signal PWRUP on line 136 is asserted. The counter, formed by the by flip-flops 260, 262, 264, and 266 having outputs on lines 270, 272, 274, and 276, respectively which are coupled to NAND gate 282. The flip-flops are clocked by the reference clock CLKREF on line 104 via NAND gate 252 having an output on line 254 coupled to the clocking input of all four flip-flops. After four consecutive clock cycles during which time the output of the Schmitt trigger circuit 250 held at logic level high, the output of gate 282 goes low, resulting in a high level signal PWRUP on line 136.

The output of NOR gate 202 on line 210 is coupled to the gate terminal of a long-channel or resistive NMOS transistor 212. When the output of gate 202 is high, some current flows from the positive supply through the resistive transistor 212 to node 216 to current source 244, preventing the current source 244 from saturating. The output of NOR gate of 202 is high when the UP signal on line 116 and the DOWN signal on line 114 and the output of NAND gate 232 are all low. The output of NAND gate 232 is low only when the output of the gate 282 on line 278 is high, indicating that the PLL circuit is not in a locked state and the enable signal on line 106 is high. The enable signal at input 106 is asserted after a predetermined time has elapsed from the power-up of the IC.

When the PWRUP signal on line 136 is high, the output signal of NAND gate 282 on line 278 coupled to NAND gate 252 causes the output of the gate on line 254 to go high, inhibiting further sampling of the Schmitt trigger output voltage on line 250 by the counter circuit 258. The output of NAND gate 232 on line 204 will also go high, which will turn on transistor 236 and discharge the capacitor 246, and turn off current sources 224 and 244. As a consequence, the PLL power-up detector will not consume quiescent current after the PLL is in a locked state The PWRUP signal will thus remain at a logic high level until a reset pulse signal on line 108 is asserted.

Figure 3:
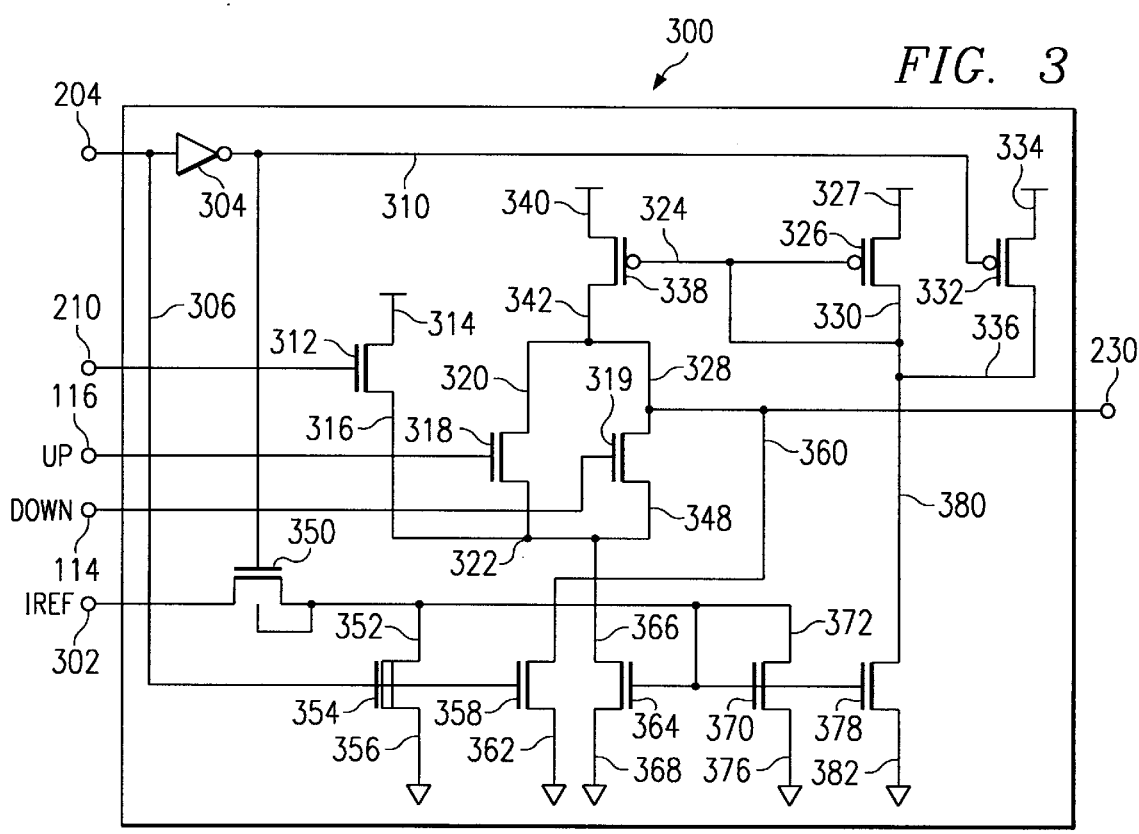
FIG. 3 shows a schematic block diagram of the charger circuit of FIG. 2.

The charging circuit 300 is shown in greater detail in FIG. 3. The output 204 of NAND gate 232 in FIG. 2 is coupled to inverter 304 which has an output coupled to the gate of a PMOS transistor 332 and the gate of a passgate transistor 350. Transistor 332 has a source coupled to the positive power supply and the drain 380 coupled to the drain of PMOS transistor 326. Transistor 326 has a source also coupled to the positive supply. The gate and source of transistor 326 are connected together. The gate of transistor 326 is also coupled to the gate of a PMOS transistor 338. Transistor 338 has its source coupled to a positive power supply and the drain coupled to the drains of transistors 218 and 219. The gate of NMOS transistor 218 is coupled to the UP signal 116 and the gate of NMOS transistor 219 is coupled to the DOWN signal 114. The output of NOR gate 202 on line 210 is coupled to the gate of NMOS transistor 212 which has a drain coupled to the power supply and the source coupled to the sources of transistors 218 and 219. The output of current reference generator 140 on line 138 is coupled via passgate transistor 350 to the drains of NMOS transistors 354 and 370 and gates of NMOS transistors 364, 370, and 378. The gates of transistors 354 and 358 are coupled to line 204 and the sources of these two transistors are coupled to ground. The drain of transistor 358 is coupled to output line 230 and the drain of transistor 378 is coupled to node 380. The source of transistor 378 is coupled to ground.

The capacitor 246 is charged at a rate determined by the amount of current generated by current source 224 which conducts current from the positive supply to the output terminal 230. The current source 224 is realized by a current mirror circuit formed by the PMOS transistors 338 and 326 and NMOS transistors 378 and 370. The stable reference current flowing into the terminal 138 from reference current generator 140 is mirrored at a positive ratio through the PMOS transistor 338 to set the charging rate of the capacitor 246.

The capacitor 246 is discharged at a rate determined by the amount of current sunk by the current source 244, which conducts current from the terminal 216 to the ground reference, only while the NMOS switch 218 or 219 is conducting or while the UP signal on line 116 or the DOWN signal on line 114 is pulsing high as previously described according to the operation of the PFD. The current source 244 is realized by a current mirror circuit formed by NMOS transistors 364 and 370.

The same stable reference current flowing into terminal 138 is mirrored at a positive ratio to NMOS transistor 364 to set the discharge rate of the capacitor 246, while the UP signal 116 on line 116 or the DOWN signal 114 is pulsing high. The gate of the long-channel or resistive NMOS transistor 212 is coupled to the NOR gate output terminal 210 to provide a weak current path between the positive supply and terminal 216 as previously described.

Charger circuit 300 is enabled when terminal 204 is at a logic low level. Inverter 304 will produce an output on line 310 at a logic high level to turn on the NMOS passgate transistor 350 to allow the reference current IREF on line 138 to bias the current mirror circuit. It should be noted that the inverter 304 may be a level-shifting inverter to ensure that the gate voltage on passgate NMOS transistor 350 is at least an NMOS threshold voltage, NCH Vth the above the IREF voltage on line 132 to transmit the full reference bias to line 372. When terminal 204 is at logic high level, the charger circuit 300 is disabled and current consumption by the circuit is eliminated. In the disabled state, NMOS passgate transistor 350 is made non-conductive, cutting off the current path of the IREF signal on line 302, NMOS transistor 354 takes line 372 to ground, making NMOS transistors 364, 370, and 378 non-conductive, and PMOS transistor 332 takes line 380 to the positive supply level, making PMOS transistors 338 and 326 non-conductive. The charger output signal is also pulled to ground by NMOS transistor 236 to keep the input signal of the Schmitt trigger 248 from becoming indeterminate and causing a crow bar current to flow through the Schmitt trigger circuit 248 in the disabled state.

The power-up detector was designed and evaluated using a SPICE circuit simulation program. Because a current source is used to regulate the charge rate of the capacitor and a second current source is used to regulate the discharge rate of the capacitor upon the application of the UP/DOWN signal from the PFD, the charge:discharge ratio is used to filter the UP/DOWN pulses if the pulses measure below some threshold. In the embodiment modeled, the charge-:discharge ratio was set to 1:10 because the PLL is considered locked when the UP/DOWN pulse width is approximately 1/10 of the CLKREF period. This was determined by the UP/DOWN pulse widths when the VCO input reaches its asymptotic value when the PLL is in a locked state.

In this example, the reference frequency CLKREF 402 shown in FIG. 4A was chosen as a 32 KHz square wave, and the gated output frequency on line 134 CLK_PLL is 256 KHz for operating a switching regulator (not shown). The VCO output signal CLKVCO on line 128 is shown as 404 in FIG. 4B.

The UP signal on line 116 is shown as 406 in FIG. 4C and the DOWN signal on line 114 is shown as 408 in FIG. 4D. The voltage across capacitor 246 is shown as signal 410 in FIG. 4E. FIG. 4F shows the signal VCOIN on line 122 as signal 412 and the power-up signal PWRUP on line 136 as signal 414. Note that when the signal 410 which is the input signal for the Schmitt trigger reaches a voltage level indicated at 416, the PLL power-up signal PWRUP 414 abruptly changes from a low state to a high state and the voltage across the capacitor 246 is then discharged to ground, as described hereinabove. It can also be seen that the signal VCOIN 412 has reached a steady state level when the PWRUP signal 414 fires high. Table 1 below summarizes the results of the SPICE simulation. Given the charge:discharge ratio and the trip point of the Schmitt trigger, the capacitor value was determined to be 2.5 pF using the following equation:

$$C = i\frac{dT}{dV} = 2.5 \text{ pF}$$

C=i<sup>dT</sup>/dv=2.5 pF where here i=1 uA from bandgap generated Ibias source; dt=28.34 uS (using a 32 KHz CLKREF); and (dV=1.15V for Schmitt trigger HIGH trip point=1.90 V, trip LOW=0.75V

|  |  | Vdd | | |
|---|---|---|---|---|
| model | temp | 2.3 V | 3.6 V | VCO input @ t = 0 |
| nn_np_nRC | 27° C. | 1.29 mS | 1.39 mS | 0 V |
| nn_np_nRC | 27° C. | 0.95 mS | 1.71 mS | Vdd |
| wn_wp_hRC | 125° C. | 2.11 mS | 1.86 mS | 0 V |
| sn_sp_lRC | −40° C. | 1.08 mS | 1.42 mS | 0 V | using a 2.5V supply.

As can be seen from the first example, it took approximately 1.29 milliseconds to achieve power-up at room temperature.

While the invention has been particularly shown and described with reference to preferred embodiments thereof, it is well understood by those skilled in the art that various changes and modifications can be made in the invention without departing from the spirit and the scope of the invention as defined by the appended claims.

What is claimed is:

1. In a phase locked loop having UP and DOWN signals responsive to a reference clock and a VCO output signal for controlling an input voltage to a VCO, a power-up detector comprising:

a first constant current source coupled to a capacitor for charging said capacitor;

a second constant current source coupled to said capacitor and responsive to said UP signal and to said DOWN signal for discharging said capacitor;

a voltage detector coupled to said capacitor for detecting voltage on said capacitor and for generating an output signal when said voltage reaches or exceeds a predetermined level.

2. The power-up detector of claim 1 wherein said output signal enables a counter for counting a predetermined number of clock cycles and generating a power-up signal if said output signal enables said counter for said predetermined number of consecutive clock cycles.

3. The power-up detector of claim 1 wherein said voltage detector is a Schmitt trigger.

4. The power-up detector of claim 1 wherein said first and second current sources are current mirror circuits which mirror a reference current provided by a reference current source.

5. The power-up detector of claim 4 wherein said power-up signal is used to gate an output of said VCO or enable the operation of a switching regulator circuit.

6. A phase locked loop circuit comprising:
   a VCO;
   a loop filter coupled to a control input of said VCO;
   a charge pump coupled to said loop filter;
   a phase-frequency detector (PFD) coupled to said charge pump, said (PFD) receiving a VCO output signal and a reference clock signal as inputs and generating an DOWN output signal if the reference clock signal makes a transition which lags the transition of the VCO output signal going in the same direction and a UP output signal if the VCO output signal makes a transition which lags the transition of the reference clock going in the same direction;
   a power-up detector comprising:
      a capacitor;
      a first constant current source coupled to said capacitor for charging said capacitor;
      a second constant current source coupled to said capacitor and responsive to said UP signal and to said DOWN signal for discharging said capacitor;
      a voltage detector coupled to said capacitor for detecting a voltage on said capacitor for generating an output signal when said voltage reaches or exceeds a predetermined level.

7. The power-up detector of claim 6 wherein said output signal enables a counter for counting a predetermined number of clock cycles and generating a power-up signal if said output signal enables said counter for said predetermined number of clock cycles.

8. The power-up detector of claim 6 wherein said voltage detector is a Schmitt trigger.

9. The power-up detector of claim 6 wherein said first and second current sources are current mirror circuits which mirror a reference current provided by a reference current source.

10. The power-up detector of claim 6 wherein said power-up signal is used to gate an output of said VCO.

11. A cellular telephone comprising:
    a switching regulator for powering a telephone circuit having a switching transistor controlled by a switching timing control signal generated by a phase-locked loop circuit, said phase-locked loop circuit comprising:
       a VCO;
       a loop filter coupled to a control input of said VCO;
       a charge pump coupled to said loop filter;
       a phase-frequency detector (PFD) coupled to said charge pump, said (PFD) receiving a VCO output signal and a reference clock signal as inputs and generating an DOWN output signal if the reference clock signal makes a transition which lags the transition of the VCO output signal going in the same direction and a UP output signal if the VCO output signal makes a transition which lags the transition of the reference clock going in the same direction;
       a power-up detector coupled between said phase-locked loop circuit and said switching regulator for withholding said switching signal from said switching regulator until said phase-locked loop achieves lock or near-lock, said power-up detector comprising:
          a capacitor;
          a first constant current source coupled to said capacitor for charging said capacitor;
          a second constant current source coupled to said capacitor and responsive to said UP signal and to said DOWN signal for discharging said capacitor;
          voltage detector coupled to said capacitor for detecting a voltage on said capacitor for generating an output signal when said voltage reaches or exceeds a predetermined level.

12. The power-up detector of claim 11 wherein said output signal enables a counter for counting a predetermined number of clock cycles and generating a power-up signal if said output signal enables said counter for said predetermined number of clock cycles.

13. The power-up detector of claim 11 wherein said voltage detector is a Schmitt trigger.

14. The power-up detector of claim 11 wherein said first and second current sources are current mirror circuits which mirror a reference current provided by a reference current source.

15. The power-up detector of claim 11 wherein said power-up signal is used to gate an output of said VCO.

16. A method of detecting power-up of a phase-locked loop comprising the steps of:
    generating an DOWN signal when a comparison of a VCO output signal and a reference clock indicates that the reference clock signal makes a transition which lags the transition of the VCO output signal going in the same direction;
    generating a UP signal when a comparison of said VCO output signal and said reference clock indicates that the VCO output signal makes a transition which lags the transition of the reference clock going in the same direction;
    charging a capacitor at a first constant current level;
    discharging said capacitor with said UP signal and said DOWN signal at a second constant current level;
    detecting a voltage on said capacitor; and
    generating an output signal if said voltage reaches or exceeds a predetermined level.

17. The method of claim 16 wherein said output signal enables a counter and further comprising the steps of:
    counting a predetermined number of cycles of a clock;
    generating a power-up signal if said output signal enables said counter for said predetermined number of clock cycles.

18. The method of claimed 17 wherein said power-up signal is used to gate an output of said VCO.

19. The method of claim 18 wherein said gated output of said VCO is used as a switching signal for a switching regulator.

20. The method of claim 19 further comprising the step of:
    said switching regulator providing regulated power to a cellular telephone.

* * * * *